United States Patent [19]

Denham

[11] Patent Number: 4,896,206

[45] Date of Patent: Jan. 23, 1990

[54] VIDEO DETECTION SYSTEM

[75] Inventor: Munroe Denham, Aloha, Oreg.

[73] Assignee: Electro Science Industries, Inc., Portland, Oreg.

[21] Appl. No.: 313,651

[22] Filed: Feb. 21, 1989

Related U.S. Application Data

[63] Continuation of Ser. No. 132,874, Dec. 14, 1987, abandoned.

[51] Int. Cl.$^4$ .......................... H04N 7/18; H04N 5/57
[52] U.S. Cl. ...................................... 358/101; 358/168
[58] Field of Search ................. 358/101, 107, 93, 168, 358/169; 382/8; 340/709

[56] References Cited

U.S. PATENT DOCUMENTS

| | | | |
|---|---|---|---|
| 4,353,087 | 10/1982 | Berry et al. .......................... | 358/101 |
| 4,364,086 | 12/1982 | Guth ..................................... | 358/101 |
| 4,441,206 | 4/1984 | Kuniyoshi et al. ............. | 358/101 X |
| 4,450,579 | 5/1984 | Nakashima et al. ............ | 358/101 X |
| 4,538,177 | 8/1985 | Morison .............................. | 358/101 |
| 4,731,745 | 3/1988 | Katagiri et al. ................. | 358/107 X |
| 4,733,229 | 3/1988 | Whitehead ....................... | 340/709 X |

Primary Examiner—James J. Groody
Assistant Examiner—Victor R. Kostak
Attorney, Agent, or Firm—Stoel Rives Boley Jones & Grey

[57] ABSTRACT

A video detection system detects the edge line of a microcircuit component that is to be trimmed by a laser trimming apparatus. The components (46, 48, 50, 52) to be trimmed are darker than the substrate (44) upon which the components are formed. The system generates a video signal corresponding to the image of the part (26) that carries the circuit. The brightness level of a selected point in the video signal is monitored. The position of the selected point corresponds to a point on the part image and is adjustable to be aligned with the point where the laser beams (24) contacts the surface of the part (26). The image is moved relative to the selected point, and as the edge of the relatively darker component to be trimmed crosses the selected point, the corresponding change in the monitored brightness level provides an indication that the edge of the component has been detected. Also provided is an alignment symbol for superimposition on the displayed image. The selected point (90) is incorporated into the alignment symbol. The alignment symbol is preferably cross hairs (88). The symbol brightness level is automatically adjustable to contrast with the brightness level of the portions of the part image over which the symbol is superimposed.

24 Claims, 1 Drawing Sheet

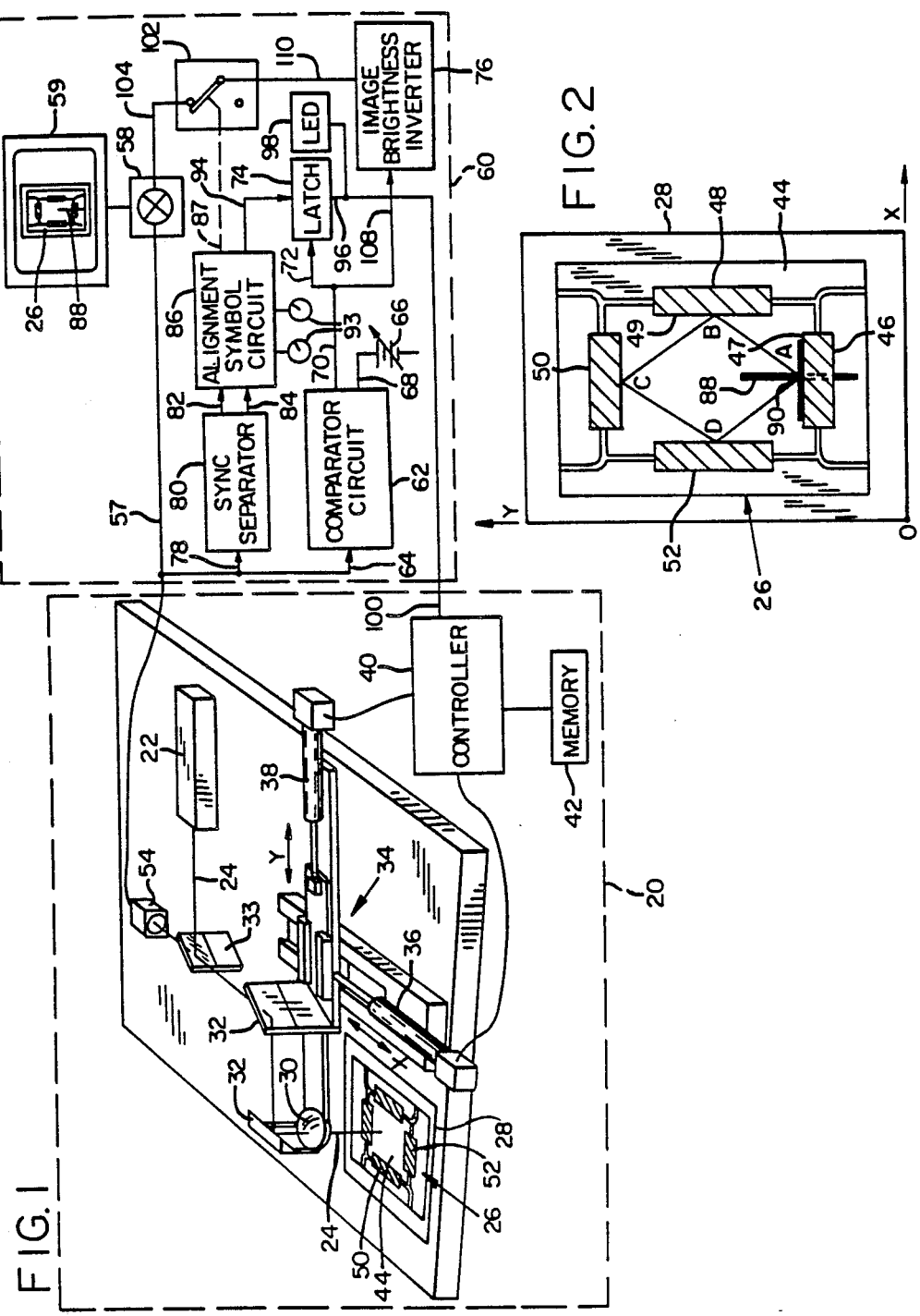

VIDEO DETECTION SYSTEM

This is a continuation of application Ser. No. 132,874, filed Dec. 14, 1987, now abandoned.

TECHNICAL FIELD

This invention pertains to systems for accurately trimming components of microcircuits with a laser beam and, in particular, to a system for precisely detecting the location of the components to be trimmed.

BACKGROUND INFORMATION

The fabrication of thick- or thin-film microcircuits entails the deposition of passive components such as resistors or capacitors upon a dielectric substrate. For example, a resistor network is formed by deposition of a resistive ink through a photolithographically prepared stencil. The ink is then dried and fired. The resulting resistance values depend upon the type of ink used, the thickness of the film and the aspect ratio (i.e., length to width ratio) of the rectangular resistors.

For some applications, the design resistance value tolerances are met through process controls during stencil preparation and ink deposition. However, in many applications, narrow resistance tolerances can be met only through the process of gradually reducing the size of the completed resistor until the resistance falls within the design tolerance. This process is often accomplished by initially forming a resistor of a size that yields a resistance of less than a specified value. The size of the resistor is then gradually decreased to progressively increase the resistance to a value within the design tolerance.

Forming the capacitive circuit components involves deposition of a conductive bottom plate, upon which a dielectric film is then deposited, dried and fired. Afterward, a conductive top plate is deposited onto the dielectric film. The bottom and top plates are ultimately connected to the conductor patterns of the circuit. One method for precisely adjusting the capacitance of each component to meet narrow design tolerances is to gradually reduce the top plate area to yield a corresponding reduction in the capacitance. When this method is employed, the capacitors may be originally formed large enough to have values that exceed those specified.

An effective method for precisely reducing the size of either the resistors or capacitor top plates is known as laser trimming. Laser trimming involves precisely directing a suitably powered laser beam against the edge of the resistor or capacitor top plate. The laser beam is maneuvered to gradually trim the edge of the component until the resistance or capacitance falls within the desired tolerance. The resistance or capacitance is continually monitored during trimming via a measurement system that comprises suitably positioned probes and associated test circuitry.

For the sake of clarity, the remaining portion of this discussion will be directed to resistor network microcircuit components fabricated through thick- or thin-film techniques, although it is understood that the discussion is equally applicable to other arrangements and combinations of components in such a microcircuit.

The relative positions of the resistors in a network are fixed according to the configuration of the stencil employed for depositing those resistors. Accordingly, a laser trimming apparatus that includes a programmable controller can be programmed to successively move the laser beam from a trimmed resistor to the edge of the next resistor to be trimmed by using position coordinate data of the resistor locations on the stencil. However, before the component-by-component laser trimming process can be initiated, it is necessary to accurately determine the position of the overall resistor network relative to the coordinate system through which the laser beam moves. That is, the laser beam positioning system, which controls movement of the beam through the coordinate system, must be initialized.

The initialization step is necessary because even though the relative positions of the individual resistors are fixed according to the stencil, the position of the entire network relative to the substrate may vary from one substrate to another because of variations in the deposition process. Hence, the position of the resistor network relative to the laser beam positioning coordinate system will vary. Such variation also occurs when the part carrying the microcircuit does not precisely register in the part-handling assembly of the laser trimming apparatus. Further, the laser beam positioning system must be initialized for each resistor network that is deposited with a single stencil onto one substrate because when more than one stencil is employed with a single substrate, the relative position of the resulting networks on the substrate may vary from one substrate to another.

A prior technique for determining the position of the resistor network relative to the coordinates of the laser positioning system can be referred to as destructive edge-sensing. That technique proceeds as follows. The position of the laser beam is moved to the center of a starting area near a selected resistor. The area is sized and oriented relative to the selected resistor so that subsequent movement of the beam in a predetermined path will always result in contact between the beam and resistor despite variations in the relative position of the network on the substrate, or variations in the registration of the part in the part-handling assembly. For example, a starting area alongside a relatively long resistor with no other components within that area would be suitable. As noted, the position of the resistor relative to the remaining resistors in the network that were deposited with the same stencil is known.

The resistance value of the resistor next to the starting area is monitored by the measurement system. The laser beam is activated and the laser positioning system moves the beam in the predetermined path, generally toward the resistor between the opposing conductor connection points on the resistor. When the beam encounters the edge of the resistor and begins removing resistive material, a change in resistance is detected by the measurement system and the beam movement is immediately stopped. The position of the beam (hence the position of the resistor edge) relative to the coordinate system is noted in the controller.

To complete the process of determining the orientation of the network relative to the coordinate system, it is necessary to detect an edge of a second resistor in the network. Accordingly, the laser beam is moved to another starting area near the edge of the second resistor, that edge being arranged so that it is not parallel to the first-detected edge. The laser beam is then activated and moved generally toward the resistor between the opposing conductor connection points on the resistor. When the beam encounters the edge of the resistor and begins removing resistive material, a change in resistance is detected by the measurement system and the beam movement is immediately stopped. The position of the second edge relative to coordinate system is noted in the controller. With the position of two distinct edges determined, the orientation of the network is readily computed using the resistor position data obtained from the stencil.

After detection of the position of the network relative to the coordinate system, the controller directs the laser beam positioning system to move the beam through a preprogrammed path corresponding to the known position of each resistor in the network. The beam is activated at appropriate intervals for trimming the resistors.

The just-described destructive edge-sensing technique for initializing the laser beam positioning system has at least two shortcomings. First, the system is slow. The beam must move from the starting point toward and into the resistor at a slow rate so that as the edge is encountered and the corresponding resistance change is detected, the beam will still be sufficiently close to the edge of the resistor to provide an accurate indication of the position of that edge. Second, if it happens that the resistors selected for detection by the destructive edge-sensing technique do not need trimming to alter their associated resistances, the destructive edge-sensing technique will damage that part of the circuitry. To avoid this latter problem, it is possible to include a pair of "reference" resistors that may be damaged by the destructive edge-sensing without affecting the overall circuitry. Adding reference resistors increases the cost of the circuit without increasing the speed of the destructive edge sensing technique.

SUMMARY OF THE INVENTION

This invention is directed to a non-destructive video detection system for detecting the edge of a microcircuit component that is to be trimmed by a laser trimming apparatus. For convenience, the circuit and substrate (including conductor patterns, leads, etc.) will be hereafter referred to as a "part."

Substantially all microcircuit components appear either darker or lighter than the substrate upon which they are deposited. That is, regardless of the particular colors of the substrate and the circuit components, in the simplest sense, one is merely darker than the other. Accordingly, there is a visually perceptible edge line where one portion of the part (for example, the substrate) meets the edge of another portion of the part (for example, a circuit component such as a resistor). This invention comprises a combination of elements for precisely detecting the edge line.

The invention particularly comprises a camera for generating a composite video signal corresponding to an image of the part. The composite video signal includes the characteristic synchronizing pulses defining a succession of fields in the video signal. A comparator circuit associated with the camera is operable for continuously sampling the brightness level of the composite video signal and for continuously comparing the brightness level of the sampled signal with a preselected reference brightness level. The comparator circuit generates a light/dark status signal that is indicative of the results of the comparison. The light/dark status signal varies between a light state and dark state and assumes the light state whenever the sampled video signal brightness level is greater than the reference brightness level. The light/dark status signal assumes the dark state whenever the sampled video signal brightness level is less than the reference brightness level. The reference brightness level is selected to be between the brightness levels of the light and dark portions of the part.

The invention also includes a detection point circuit that is associated with the video signal and the light/dark status signal. The detection point circuit determines the state of the light/dark status signal at a preselected detection point in each successive field of the video signal. The detection point in the video signal fields corresponds to a particular point on the image of the part. The detection point circuit also provides a detection point status signal that is indicative of the state of the light/dark status signal at the detection point (i.e., at the corresponding point on the part image).

The part image is movable relative to the detection point. Further, the detection point position is adjusted to coincide with the point where the laser beam contacts the part. Consequently, movement of the image results in movement of the detection point (and beam position) over the part image. As the edge line of the adjacent light and dark portions of the part image crosses the detection point, the detection point circuit detects the resulting change in the state of the light/dark status signal and produces a corresponding change in the detection point status signal. This change in the detection point status signal is applied to any suitable output device to alert the system operator. Preferably, the detection point status signal is applied to the controller of the laser trimming apparatus, which is therefore apprised that the edge line is positioned precisely in line with the laser beam.

The beam position at the edge line is correlated to the coordinate system of the laser beam positioning system. A second edge line, which corresponds to the edge of a second component, is next sensed by the system in the manner just described. With two separate edge lines detected, the precise relative position of all components on the part that were formed with the same stencil can be readily correlated to the coordinate system of the laser beam positioning system.

As another aspect of this invention, a video monitor displays the image of the part on a screen. An alignment symbol is generated and displayed on the monitor screen and is superimposed on the displayed part image. The symbol comprises at least one line. The detection point circuit and alignment symbol-generating circuit are operatively associated so that the detection point is collinear with the line. Preferably, two crossed lines are displayed by the symbol-generating circuitry, and the detection point is located at the intersection of those lines. As a result, useful cross hairs are displayed on the screen to permit monitoring of the laser trimming operation by an operator.

As yet another aspect of this invention, a contrast control means selectively and automatically varies the brightness level of a portion or the entire length of a symbol line to provide suitable contrast relative to the brightness of the portion of the part over which the line is superimposed.

BRIEF DESCRIPTION OF THE DRAWINGS

FIG. 1 is a diagram of the system designed in accordance with this invention to detect the precise locations of the components of a part positioned in the system.

FIG. 2 depicts a video image of the part positioned in the system of FIG. 1.

DETAILED DESCRIPTION OF A PREFERRED EMBODIMENT

With reference to FIGS. 1 and 2, a preferred embodiment of the present invention is adapted for use with a laser trimming apparatus 20 such as the Model 44, or Model 44 PLUS, or Model 80 Laser Trimming System manufactured by Electro Scientific Industries, Inc. of Portland, Oreg. The primary components laser trimming apparatus 20 are shown in simplified form and include a laser beam generator 22 for generating a laser beam 24 of suitable energy for removing microcircuit component material such as the resistive ink that forms the individual resistors in a thick- or thin-film type resistor network. A part 26 is securely registered in the part handler 28 of the laser trimming apparatus. The beam position on the part 26, which carries the circuit and associated leads, is movable within a coordinate system designated by the orthogonal X and Y arrows shown in the figures.

The beam position is moved by a laser beam positioning system. The laser beam positioning system generally comprises optical elements 30, 32, 33, a carriage assembly 34, linear motors 36, 38 and a programmable controller 40. Specifically, the optical elements include a lens 30, and two mirrors 32 that are mounted on the carriage assembly 34. The laser beam 24 emanates from the generator 22 and is reflected off a stationary dichroic mirror 33, which reflects the laser light but transmits visible light. The reflected laser beam is directed by the mirrors 32, through a lens 30, to the upper surface of the part 26. The carriage assembly 34, hence the beam position relative to the part surface, is movable in the X-direction by a connected X-direction linear motor 36 and in the Y-direction by a connected Y-direction linear motor 38.

The linear motors 36, 38 are actuated by the programmable controller 40, which is programmed so that within its associated memory 42 is stored the precise path to be taken by the beam 24 as it is moved to strike the various components of the part 26. A simplified exemplary part 26 is depicted in FIG. 1. The video image of that part (that image is produced as hereafter described) is depicted in FIG. 2. The part 26 includes an upper substrate surface 44 upon which a network of four resistors 46, 48, 50, 52 has been formed by a process such as thick- or thin-film deposition. The four resistors are all formed with the same photolithographically prepared stencils; thus, the relative positions of the resistors are fixed by the stencil configuration. The controller memory 42 stores information representing the position of each resistor relative to a reference resistor. This information is referred to herein as "resistor relative position information." If, for example, the laser trimming operation calls for trimming all four resistors 46, 48, 50, 52, the controller 40 will read the resistor relative position data and generate a sequence of signals that is applied to the X-direction linear motor 36 and the Y-direction linear motor 38 to move the appropriate motor counts (one motor count corresponding to the beam moving approximately 2.5 microns along the part) to follow a particular path, such as depicted as path ABCD in FIG. 2.

The beam position on the part is monitored by the operator. Specifically, the part is illuminated by an internal light source (not shown) and its optical image is reflected by the mirrors 32, through the dichroic mirror 33, into a video camera 54. The camera 54 produces a composite video signal corresponding to the optical image of the part. That composite signal includes the characteristic synchronization ("sync") pulses for defining a succession of fields in the video signal. The video signal is applied via cable 57 through a mixer circuit 58 to a video monitor 59 such as a Sanyo Model VM4509. The image of the part is reproduced on the monitor screen (see FIG. 2) for viewing by the operator.

As noted earlier, the overall position of the resistor network on a substrate may vary from one part to another. Further, it is possible that a part may not be precisely registered in the part handler 28 of the laser trimming apparatus. Therefore, before the beam 24 can be moved along the appropriate path ABCD between resistors 46, 48, 50, 52, the starting point of that path must be initialized relative to the coordinate system of the laser beam positioning system. For convenience, that coordinate system is hereafter referred to as the X-Y coordinate system having an origin position O that is constant and stored in the controller memory 42. The origin position O is shown in the lower left-hand corner of FIG. 2.

The preferred technique for initializing the laser beam positioning system is to detect the precise location of two distinct resistor edges (i.e., as viewed in plan, FIG. 2) relative to the X-Y coordinate system. For instance, the edge 47 of resistor 46 and the edge 49 of resistor 48 are selected. Once detected, the positions of these edges are readily correlated to the X-Y coordinate system because the controller monitors the number of motor counts necessary for the linear motors 36, 38 to move the beam position from a known point, for example the origin O of the coordinate system, to the two detected edges. The edges 47, 49 selected for detection are such that no other edges are immediately adjacent to them. Accordingly, as the system operates to detect the selected edges 47, 49, there will be no inadvertent detection of an edge that is close to, but not one of, the selected edges.

The preferred embodiment of the video detection system formed in accordance with this invention provides a nondestructive means of precisely detecting the selected edges. Specifically, the video detection system 60 includes a comparator circuit 62, one input 64 of which receives the video signal generated by the camera 54. As noted, the video signal corresponds to the image of the part 26 in the part handler 28. The comparator circuit continuously samples the brightness level of the composite video signal. An operator-adjustable voltage source 66 is connected to the comparator circuit 62. The operator adjusts the voltage source until a voltage corresponding to a reference brightness level is applied to a second comparator circuit input 68. As will become clear upon reading this description, the reference signal brightness level is selected to be between the brightness levels of the substrate 44 (typically relatively light) and the brightness level of a resistor (typically relatively dark).

The comparator circuit 62 continuously compares the reference brightness level with the sampled brightness level of the video signal. The output 70 of the comparator circuit is a light/dark status signal indicative of the results of the comparison. That is, at each point in time along the video signal (hence, at each corresponding point on the video image carried by the signal), the light/dark status signal will assume either a light state or a dark state. The light/dark status signal assumes a light state when the sampled portion of the video signal is comparatively lighter than the reference brightness level. Likewise, the light/dark status signal assumes a dark state when the sampled portion of the video signal is comparatively darker than the reference brightness level. The light/dark status signal is applied to the input 72 of a latch circuit 74 and to an image brightness inverter circuit 76, the functions of these circuits being described more fully below.

The video signal generated by camera 54 is also applied to an input 78 of a video signal sync separator circuit 80. The sync separator circuit detects and separates the horizontal and vertical sync pulses of the composite video signal. The horizontal and vertical sync pulses are applied to the respective inputs 82, 84 of an alignment symbol circuit 86. The alignment symbol circuit 86 generates a control signal corresponding to an alignment symbol 88, preferably cross hairs, for superimposition on the part image that is displayed on the screen of the monitor 59. The position of the cross hairs on the screen is adjustable via controls 93 that alter the alignment symbol control signal so that the center point 90 of the cross hairs can be precisely aligned with the point the laser beam contacts the part. As will be explained hereafter, before the alignment symbol is displayed, the brightness level of the symbol is processed to provide an easily viewable symbol regardless of the brightness level of the image over which the symbol is superimposed.

The alignment symbol circuit 86 generates a timing signal corresponding to the center point 90 of the cross hairs. The particular point on the part image over which the center point 90 of the cross hairs is ultimately superimposed will be hereinafter referred to as the "detection point." The center point timing signal is applied to the enable input 94 of the latch circuit 74. Accordingly, the latch circuit latches and provides on its output 96 the state of the light/dark status signal corresponding to the detection point on the part image. For a conventional 60 Hz field rate or vertical scanning frequency, the latch is updated every 16.6 milliseconds. For clarity, the output of the latch circuit will be referred to as the detection point status signal.

In view of the above, it can be appreciated that when the cross hairs 88 are superimposed on the part image, and the laser positioning system is arranged so that the cross hairs center point 90 is aligned with a point (i.e., the detection point) on the substrate portion 44 of the part image, the light/dark status signal corresponding to the detection point on the image will be in the light state. Accordingly, the output of the latch circuit 74 is a detection point status signal that corresponds to the light state of the light/dark status signal. The detection point status signal provided on the output 96 of the latch circuit 74 can be applied to any external device such as a light-emitting diode 98 for providing a visual indication of the state (light or dark) of the detection point on the image. Preferably, the detection point status signal is applied via controller input 100 to the controller 40 of the laser trimming apparatus.

As the laser beam positioning system moves the beam 24 over the substrate toward a resistor, the detection point on the part image, which is aligned with the center point 90 of the cross hairs 88, travels along the light substrate toward the dark resistor. Accordingly, the detection point status signal will change from the light state to the dark state as the edge line between the light substrate and the dark resistor becomes aligned with the detection point. Consequently, at the instant this change in the detection point status signal occurs, the cross hairs and laser beam path will be aligned with the edge of the resistor. Because the detection point status signal is applied to the laser trimming system controller 40, the controller is instantly apprised of the change so that the positions of the linear motors 36, 38 can be read to correlate the edge position to the X-Y coordinate system of the laser beam positioning system as described earlier. Further, when a second, distinct edge is detected in the manner just described, the controller is provided with enough information to calculate the orientation of the entire resistor network relative to the X-Y coordinate system and the initialization process is complete.

It is contemplated that alignment symbol configurations other than cross hairs may be employed. Further, the system would still be useful if the alignment symbol circuit 86 generated no alignment symbol but merely provided a timing signal to the latch circuit that corresponds to a detection point on the image, the detection point being aligned with the laser beam path. However, an alignment symbol is extremely useful for monitoring the laser trimming operation.

The video detection system of the present invention includes means for automatically adjusting the brightness level of the alignment symbol to contrast with the brightness of the image over which the symbol is superimposed, thereby resulting in an easily viewable symbol regardless of the background brightness level. Generally, the brightness level of the portion of the part image over which the alignment symbol is superimposed is detected as either light or dark. If that portion is light, the image brightness inverter circuit 76, in conjunction with the alignment symbol circuit, will generate an alignment symbol that is dark. Conversely, if a portion of the image in which the alignment symbol is superimposed is detected as dark, the generated alignment symbol will be light Further, when the alignment symbol is superimposed over both light and dark image portions, the symbol will be generated with corresponding dark and light contrasting portions.

Specifically, the image brightness inverter circuit 76 receives on its input 108 the light/dark status signal produced by the comparator circuit 62. The output of the image brightness inverter circuit is either a voltage indicative of a high brightness level or a voltage indicative of a low brightness level. In this regard, the image brightness inverter circuit includes suitable voltage sources and a relay responsive to the light/dark status signal to apply on its output 110 a high brightness level when the light/dark status signal is in the dark state and a low brightness level when the light/dark status signal is the light state. The alignment symbol circuit 86 provides a control signal at its output 87 to close a relay 102 and apply the output of the image brightness inverter circuit 76 to one input 104 of the mixer circuit 58 at intervals corresponding to the configuration of the cross hairs 88. The output of the brightness level inverter circuit that is applied to the mixer circuit 58 is mixed with the camera-generated video signal, amplified, and applied to the monitor 59. As a result, the displayed part image (FIG. 2) includes superimposed cross hairs 88 having portions with high brightness level where the portion of the image over which the cross hair is superimposed is dark. Conversely, some portions of the cross hairs will have a low brightness level where the portion of the image over which these cross hairs portions are superimposed is light.

It can be appreciated that when the cross hairs formed in accordance with this invention are superimposed over both light and dark portions of the part image, the operator can easily adjust the reference brightness level of the comparator circuit 62 by observing the cross hairs brightness level and adjusting the reference level until the portion of the cross hairs that is over a dark portion of the image is light and until the portion of the cross hairs that is over the light portion of the image is dark.

While this invention has been described with reference to a preferred embodiment, it is clearly understood by those skilled in the art that the invention is not limited thereto, rather the scope of the invention is to be interpreted only in conjunction with the appended claims.

I claim:

1. A video detection system for detecting the common edge line of adjacent first and second portions of an article in a predetermined orientation, comprising:
   video means for generating a video signal corresponding to a video image of the article, the video signal including a brightness level of changing magnitude in response to differences in a brightness of the image of the first and second portions of the article;
   comparison means in communication with the video means for comparing a reference brightness magnitude with the magnitude of the video signal brightness level and for providing a brightness status signal that assumes first and second states whenever the magnitude of the video signal brightness level is, respectively, greater than and less than the reference brightness magnitude; and
   detection point means for establishing within the video image a detection point at a selectable position that is independent of the orientation of the common edge line, the detection point means cooperating with the video means so that the detection point is movable from one of the first and second portions to the common edge line,
   whereby the state of the brightness status signal changes whenever the detection point moves from one of the first and second portions to the common edge line and the change in the state of the brightness status signal represents detection of the common edge line.

2. The system of claim 1 further comprising:
   video display means receiving the video signal for displaying the video image of the article on a viewing screen; and
   alignment symbol means cooperating with the detection point means and the video display means for superimposing on the video image an alignment symbol including a line that is collinear with the detection point.

3. The system of claim 2 in which the alignment symbol means includes means for displaying within the alignment symbol the state of the brightness status signal.

4. The system of claim 2 in which the alignment symbol includes a pair of lines intersecting at a point and in which the detection point is positioned at the point of intersection of the intersecting lines.

5. The system of claim 2 in which the video display means includes a monochrome display apparatus.

6. The system of claim 2 in which the selected position of the detection point is fixed on the video screen and the detection point means cooperates with the video means to move the image of the article relative to the selected position of the detection point.

7. The system of claim 2 further including contrast means in cooperation with the alignment symbol means and the video means for providing sections of the alignment symbol that are superimposed on the video image of the first and second portions with brightness levels representing the second and first states, respectively, thereby to provide an alignment symbol that contrasts with portions of the video image on which the alignment symbol is superimposed.

8. The system of claim 1 further including brightness status display means receiving the brightness status signal for displaying the state of the brightness status signal.

9. The system of claim 1 in which the comparison means continuously compares the magnitude of the video signal brightness level with the reference brightness magnitude to provide a continuous brightness status signal.

10. The system of claim 9 further comprising latch means in communication with the comparison means and the detection point means for sampling the continuous brightness status signal whenever it corresponds to the detection point, thereby to determine the state of the brightness status signal corresponding to the detection point.

11. The system of claim 1 in which the comparison means includes a voltage comparator circuit.

12. The system of claim 1 in which the video signal includes synchronizing pulses that define a succession of image fields and in which the detection point means identifies the preselected detection point in successive ones of the image fields.

13. In a laser trimming apparatus having laser means for generating a laser beam to trim a component of a microcircuit in a predetermined orientation and having first and second adjacent portions with a common edge line between them, the improvement comprising:
   video means for generating a video signal corresponding to a video image of the microcircuit, the video signal including a brightness level of changing magnitude in response to differences in a brightness of the image of the first and second portions of the microcircuit;
   comparison means in communication with the video means for comparing a reference brightness magnitude with the magnitude of the video signal brightness level and for providing a brightness status signal that assumes first and second states whenever the magnitude of the video signal brightness level is, respectively, greater than and less than the reference brightness magntidue; and
   detection point means for establishing within the video image a detection point at a selectable position that is independent of the orientation of the common edge line, the detection point means cooperating with the video means so that the detection point is movable from one of the first and second portions to the common edge line,
   whereby the state of the brightness status signal changes whenever the detection point moves from one of the first and second portions to the common edge line and the change in the state of the brightness status signal represents detection of the common edge line.

14. The system of claim 13 further comprising:

video display means receiving the video signal for displaying the video image of the article on a viewing screen; and alignment symbol means cooperating with the detection point means and the video display means for superimposing on the video image an alignment symbol including a line that is collinear with the detection point.

15. The system of claim 14 in which the alignment symbol means includes means for displaying within the alignment symbol the state of the brightness status signal.

16. The system of claim 14 in which the alignment symbol includes a pair of lines intersecting at a point and in which the detection point is positioned at the point of intersection of the intersecting lines.

17. The system of claim 14 in which the video display means includes a monochrome display apparatus.

18. The system of claim 14 in which the selected position of the detection point is fixed on the viewing screen and the detection point means cooperates with the video means to move the image of the article relative to the selected position of the detection point.

19. The system of claim 14 further including contrast means in cooperation with the alignment symbol means and the video means for providing sections of the alignment symbol that are superimposed on the video image of the first and second portions with brightness levels representing the second and first states, respectively, thereby to provide an alignment symbol that contrasts with portions of the video image on which the alignment symbol is superimposed.

20. The system of claim 13 further including brightness status display means receiving the brightness status signal for displaying the state of the brightness status signal.

21. The system of claim 13 in which the comparison means continuously compares the magntidue of the video signal birghtness level with the reference brightness magntidue to provide a continuous brightness status signal.

22. The system of claim 21 further comprising latch means in communication with the comparison means and the detection point means for sampling the brightness status signal whenever it corresponds to the detection point, thereby to determine the state of the brightness status signal corresponding to the detection point.

23. The system of claim 13 in which the comparison means includes a voltage comparator circuit.

24. The system of claim 13 in which the video signal includes synchronizing pulses that define a succession of image fields and in which the detection point means identifies the preselected detection point in successive ones of the image fields.

* * * * *